(12) United States Patent
Tanaka et al.

(10) Patent No.: US 11,177,252 B2
(45) Date of Patent: Nov. 16, 2021

(54) SEMICONDUCTOR DEVICE AND METHOD OF FABRICATING THE SAME

(71) Applicant: LAPIS Semiconductor Co., Ltd., Yokohama (JP)

(72) Inventors: Hiroyuki Tanaka, Yokohama (JP); Masahiko Higashi, Yokohama (JP)

(73) Assignee: LAPIS Semiconductor Co., Ltd., Yokohama (JP)

( * ) Notice: Subject to any disclaimer, the term of this patent is extended or adjusted under 35 U.S.C. 154(b) by 0 days.

(21) Appl. No.: 16/828,958

(22) Filed: Mar. 25, 2020

(65) Prior Publication Data

US 2020/0312836 A1 Oct. 1, 2020

(30) Foreign Application Priority Data

Mar. 29, 2019 (JP) .............................. JP2019-069320

(51) Int. Cl.
*H01L 27/02* (2006.01)
*H01L 21/265* (2006.01)
*H01L 21/761* (2006.01)

(52) U.S. Cl.
CPC .... *H01L 27/0255* (2013.01); *H01L 21/26513* (2013.01); *H01L 21/761* (2013.01)

(58) Field of Classification Search
CPC ........... H01L 27/0255; H01L 21/26513; H01L 21/761; H01L 27/0207; H01L 29/0615; H01L 21/82
See application file for complete search history.

(56) References Cited

U.S. PATENT DOCUMENTS

2002/0053704 A1* 5/2002 Avery ................. H01L 27/0255
257/361

FOREIGN PATENT DOCUMENTS

JP 5835977 12/2015

* cited by examiner

*Primary Examiner* — David Vu
(74) *Attorney, Agent, or Firm* — JCIPRNET

(57) ABSTRACT

The semiconductor device and the method of fabricating the same includes, on a surface of a semiconductor substrate 1 of a first conductivity type which is P-type or N-type, a diode element using a PN junction including a high-concentration first conductivity type impurity region 6 of the first conductivity type, a high-concentration second conductivity type impurity region 5 of a second conductivity type that is a conductivity type opposite to the first conductivity type, and an element isolation region 2 sandwiched between the high-concentration first conductivity type impurity region and the high-concentration second conductivity type impurity region, and a floating layer 3 of the second conductivity type separated from the high-concentration second conductivity type impurity region below the high-concentration second conductivity type impurity region on the semiconductor substrate.

7 Claims, 13 Drawing Sheets

■ Current-voltage characteristics according to first example
▲ Current-voltage characteristics according to conventional technology
♦ Leakage current characteristics after evaluation of current-voltage characteristics under each condition according to first example

SEMICONDUCTOR DEVICE AND METHOD OF FABRICATING THE SAME

CROSS-REFERENCE TO RELATED APPLICATION

This application claims the priority benefit of Japan Application No. 2019-069320, filed on Mar. 29, 2019. The entirety of the above-mentioned patent application is hereby incorporated by reference herein and made a part of this specification.

BACKGROUND

Technical Field

The disclosure relates to a semiconductor device and a method of fabricating the same.

Description of Related Art

A protection diode for protecting an internal circuit from an unintended excessive input voltage or current due to electrostatic discharge (ESD) is usually provided at a signal input terminal of a semiconductor device such as, for example, a semiconductor integrated circuit for a driver.

As a protection diode, for example, a PN junction diode formed by implanting N-type impurities into a surface of a P-type well formed on a P-type substrate has been proposed (see Patent Document 1).

PATENT DOCUMENTS

[Patent Document 1] Japanese Patent No. 5835977

In relation to a protection diode, FIG. 8 illustrates an example of a plan view of a conventional structure, and FIG. 9 illustrates an example of a cross-sectional view of the conventional structure. In the examples illustrated in FIGS. 8 and 9, an element having a side of 20 µm is illustrated as a planar structure, and a silicon substrate at a position deeper than 10 µm is omitted in the cross-sectional structure.

A P-type well 104 is formed over the entire surface near a surface of a P-type silicon substrate 101, and a high-concentration N-type active layer 105 and a high-concentration P-type active layer 106 are formed adjacent to each other with an element isolation region 102 (shallow trench isolation(STI)) made of a silicon oxide film having a width of about 1 µm to 3 µm interposed therebetween. A junction formed between the high-concentration N-type active layer 105 and the P-type well 104 serves as a PN junction diode that configures a protection diode.

The high-concentration N-type active layer 105 and the high-concentration P-type active layer 106 function as a cathode electrode and an anode electrode, respectively. The high-concentration N-type active layer 105 and the high-concentration P-type active layer 106 are conducted through contacts 108 to separate aluminum interconnections 109 which are formed with an interlayer insulating film 107 made of a silicon oxide film interposed therebetween. When the protection diode of the present structure is inserted between an input/output unit of a semiconductor integrated circuit and the ground, the ground side is connected to an anode terminal, and the input/output side is connected to a cathode terminal.

The protection diode connected as described above is required to have a reverse breakdown voltage that can withstand an input voltage of excessively high positive potential. At the same time, the protection diode is required to have a forward breakdown current that can also withstand a forward current accompanied by an input voltage of excessively high negative potential. Further, along with miniaturization of semiconductor integrated circuits, a reduction in element area is also required.

However, in the semiconductor device having the above-described structure as illustrated in FIGS. 8 and 9, it is difficult to improve the reverse breakdown voltage while maintaining suppression of deterioration in forward current-voltage characteristics and forward breakdown current and increase in element area.

SUMMARY

The disclosure provides a semiconductor device and a method of fabricating the same in which deterioration in forward current-voltage characteristics and forward breakdown current and increase in element area can be suppressed, and a reverse breakdown voltage can be improved.

A semiconductor device according to the disclosure includes a diode element using a PN junction, in which on a surface of a semiconductor substrate of a first conductivity type which is P-type or N-type includes a high-concentration first conductivity type impurity region of the first conductivity type, a high-concentration second conductivity type impurity region of a second conductivity type that is a conductivity type opposite to the first conductivity type, and an element isolation region sandwiched between the high-concentration first conductivity type impurity region and the high-concentration second conductivity type impurity region; and a floating layer of the second conductivity type separated from the high-concentration second conductivity type impurity region below the high-concentration second conductivity type impurity region on the semiconductor substrate.

A method of fabricating a semiconductor device according to the disclosure, which is a method of fabricating the semiconductor device according to the disclosure, includes a process of preparing a semiconductor substrate of the first conductivity type, a process of forming the element isolation region on the semiconductor substrate, a process of forming the floating layer by performing a second impurity implantation and at least one impurity implantation of a first impurity implantation and a third impurity implantation among the first impurity implantation in which impurities of the second conductivity type are ion-implanted once or a plurality of times, the second impurity implantation in which impurities of the first conductivity type are ion-implanted once or a plurality of times, and the third impurity implantation in which impurities of the second conductivity type are ion-implanted once or a plurality of times in the numerical order of the impurity implantations for a region including a portion of the semiconductor substrate to be the high-concentration second conductivity type impurity region, a process of forming the high-concentration second conductivity type impurity region by ion-implanting impurities of the second conductivity type once or a plurality of times into the portion of the semiconductor substrate to be the high-concentration second conductivity type impurity region, and a process of forming the high-concentration first conductivity type impurity region by ion-implanting impurities of the first conductivity type once or a plurality of times into a portion of the semiconductor substrate to be the high-concentration first conductivity type impurity region.

According to the disclosure, a semiconductor device and a method of fabricating the same in which deterioration in forward current-voltage characteristics and forward breakdown current and increase in element area can be suppressed, and a reverse breakdown voltage can be improved are provided.

DESCRIPTION OF THE EMBODIMENTS

Figure 1:
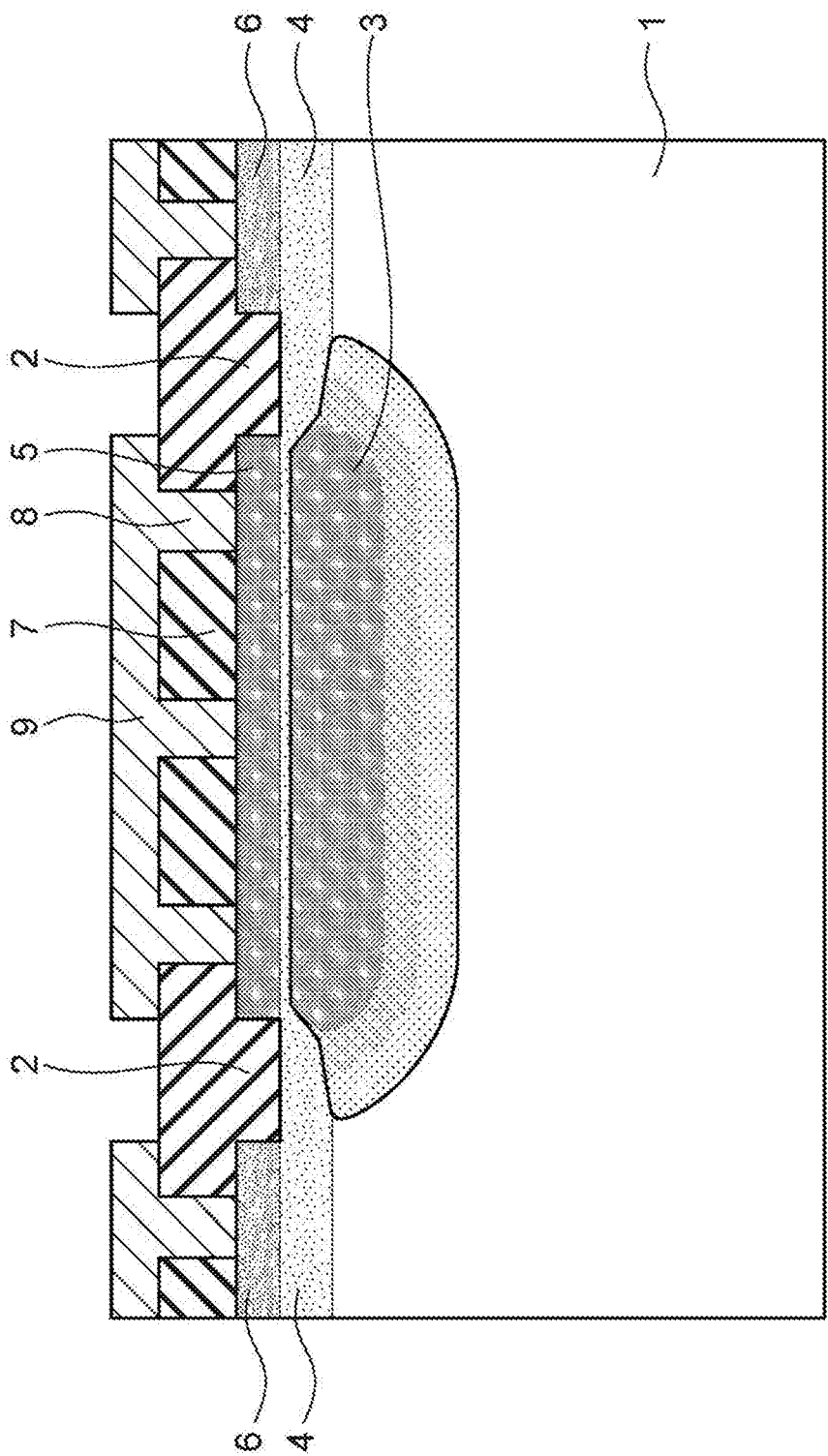
FIG. 1 is a schematic cross-sectional view illustrating an example of a semiconductor device according to a first embodiment of the disclosure.

Hereinafter, embodiments of the disclosure will be described with reference to the drawings. In the drawings, substantially the same or equivalent components or portions are denoted by the same reference signs.

Also, in the present specification, the term "process" includes not only an independent process but also a case of a process that cannot be clearly distinguished from other processes as long as an intended purpose of the process is achieved.

A semiconductor device according to the disclosure includes a diode element using a PN junction, in which on a surface of a semiconductor substrate of a first conductivity type which is P-type or N-type includes a high-concentration first conductivity type impurity region of the first conductivity type, a high-concentration second conductivity type impurity region of a second conductivity type that is a conductivity type opposite to the first conductivity type, and an element isolation region sandwiched between the high-concentration first conductivity type impurity region and the high-concentration second conductivity type impurity region; and a floating layer of the second conductivity type separated from the high-concentration second conductivity type impurity region below the high-concentration second conductivity type impurity region on the semiconductor substrate.

The semiconductor substrate of the first conductivity type and the high-concentration first conductivity type impurity region of the first conductivity type contain impurities of the first conductivity type, and the high-concentration first conductivity type impurity region contains impurities of the first conductivity type at a concentration higher than that in the semiconductor substrate.

The high-concentration second conductivity type impurity region of the second conductivity type and the floating layer of the second conductivity type contain impurities of the second conductivity type. The floating layer is a layer that overlaps the high-concentration second conductivity type impurity region in a plan view and exists at a region deeper than the high-concentration second conductivity type impurity region in the semiconductor substrate without being electrically connected to the diode element. An impurity concentration of the second conductivity type in the floating layer is, for example, lower than an impurity concentration of the second conductivity type in the high-concentration second conductivity type impurity region.

Also, the element isolation region is a region sandwiched between the high-concentration first conductivity type impurity region and the high-concentration second conductivity type impurity region and is formed of an insulating material such as an oxide film, a nitride film, or the like.

According to the semiconductor device according to the disclosure, when the above-described floating layer is provided, the diode element can function as a protection diode that protects an internal circuit of the semiconductor device against an excessive input voltage or current due to, for example, electrostatic discharge (ESD), and thereby a highly reliable semiconductor device is obtained.

Although one of the first conductivity type and the second conductivity type may be P-type and the other thereof may be N-type, it is preferable that the first conductivity type be P-type and the second conductivity type be N-type from a viewpoint of easiness in fabrication.

Also, the diode element may be a protection diode which protects an internal circuit of a semiconductor integrated circuit against an excessive input voltage or current due to ESD or the like.

Although a method of fabricating the semiconductor device according to the disclosure is not particularly limited, the semiconductor device can be suitably fabricated by a method of fabricating the semiconductor device including a process of preparing a semiconductor substrate of the first conductivity type, a process of forming the element isolation region on the semiconductor substrate, a process of forming the floating layer by performing a second impurity implantation and at least one impurity implantation of a first impurity implantation and a third impurity implantation among the first impurity implantation in which impurities of the second conductivity type are ion-implanted once or a plurality of times, the second impurity implantation in which impurities of the first conductivity type are ion-implanted once or a plurality of times, and the third impurity implantation in which impurities of the second conductivity type are ion-implanted once or a plurality of times in the numerical order of the impurity implantations for a region including a portion of the semiconductor substrate to be the high-concentration second conductivity type impurity region, a process of forming the high-concentration second conductivity type impurity region by ion-implanting impurities of the second conductivity type once or a plurality of times into the portion of the semiconductor substrate to be the high-concentration second conductivity type impurity region, and a process of forming the high-concentration first conductivity type impurity region by ion-implanting impurities of the first conductivity type once or a plurality of times into a portion of the semiconductor substrate to be the high-concentration first conductivity type impurity region.

In the process of forming the floating layer, both the first impurity implantation and the third impurity implantation may be performed, but only the third impurity implantation may be performed or only the first impurity implantation may be performed in order to simplify fabrication processes.

Also, in order to simplify the fabrication processes, some or all of the impurity implantations in the process of forming the floating layer may be performed concurrently with an impurity implantation for a region other than the diode element.

In contrast to a conventional semiconductor device in which ESD breakdown due to an insufficient reverse breakdown voltage is observed, in the disclosure, a reverse breakdown voltage can be improved without affecting, for example, an element area, formation processes, forward current-voltage characteristics, and a forward breakdown current of the input/output protection diode, and as a result, it is possible to provide a highly reliable semiconductor device.

Hereinafter, a semiconductor device and a method of fabricating the same according to the disclosure will be specifically described using three embodiments as examples.

First Embodiment

FIG. 1 schematically illustrates a cross section of a semiconductor device according to a first embodiment of the disclosure. In the semiconductor device according to the first embodiment, a first conductivity type is P-type and a second conductivity type is N-type. The semiconductor device includes a diode element using a PN junction including a high-concentration P-type active layer 6 (high-concentration first conductivity type impurity region), a high-concentration N-type active layer 5 (high-concentration second conductivity type impurity region), and an element isolation region 2 sandwiched between the high-concentration P-type active layer 6 and the high-concentration N-type active layer 5 on a surface of the P-type silicon substrate 1, and an N-type floating layer 3 separated from the high-concentration N-type active layer below the high-concentration N-type active layer 5 (that is, formed with a part of a P-type silicon substrate 1 interposed therebetween).

In the semiconductor device according to the first embodiment, when the N-type floating layer is provided below the PN junction as described above, the diode element can function as a protection diode that protects an internal circuit of the semiconductor device against an excessive input voltage or current due to, for example, ESD, and thereby a highly reliable semiconductor device is obtained.

Figure 8:
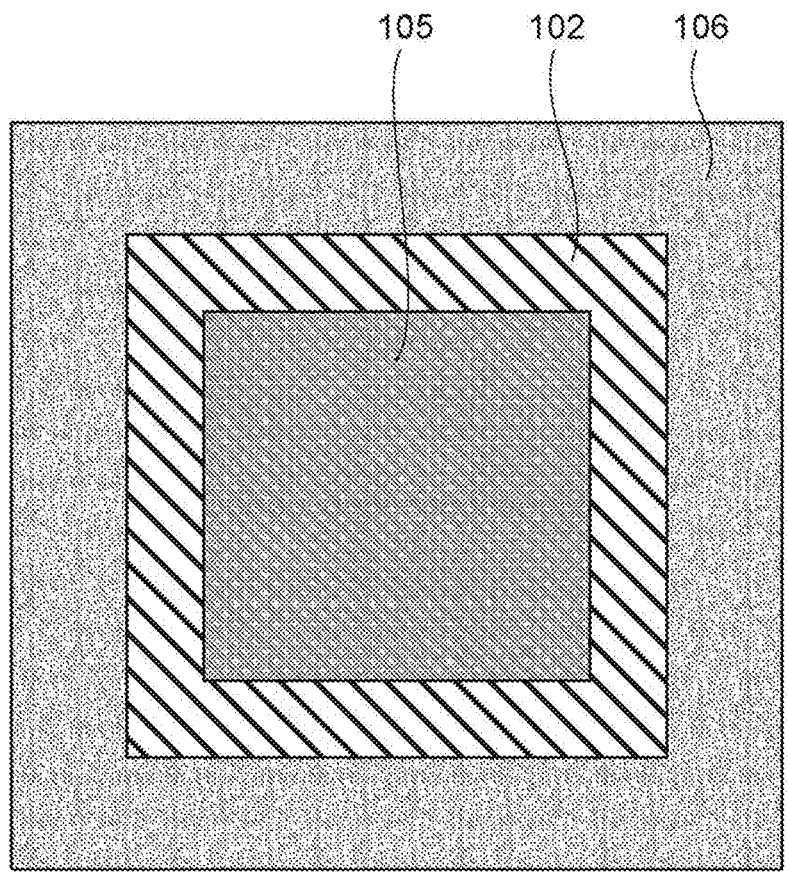
FIG. 8 is a schematic plan view illustrating an example of a structure of a conventional protection diode.

Although the semiconductor device according to the first embodiment further includes a P-type well 4, an interlayer insulating film 7, a contact 8, and an aluminum interconnection 9, the semiconductor device according to the first embodiment in a plan view has the same configuration as that in FIG. 8 and an increase in element area is suppressed.

Figure 2A:
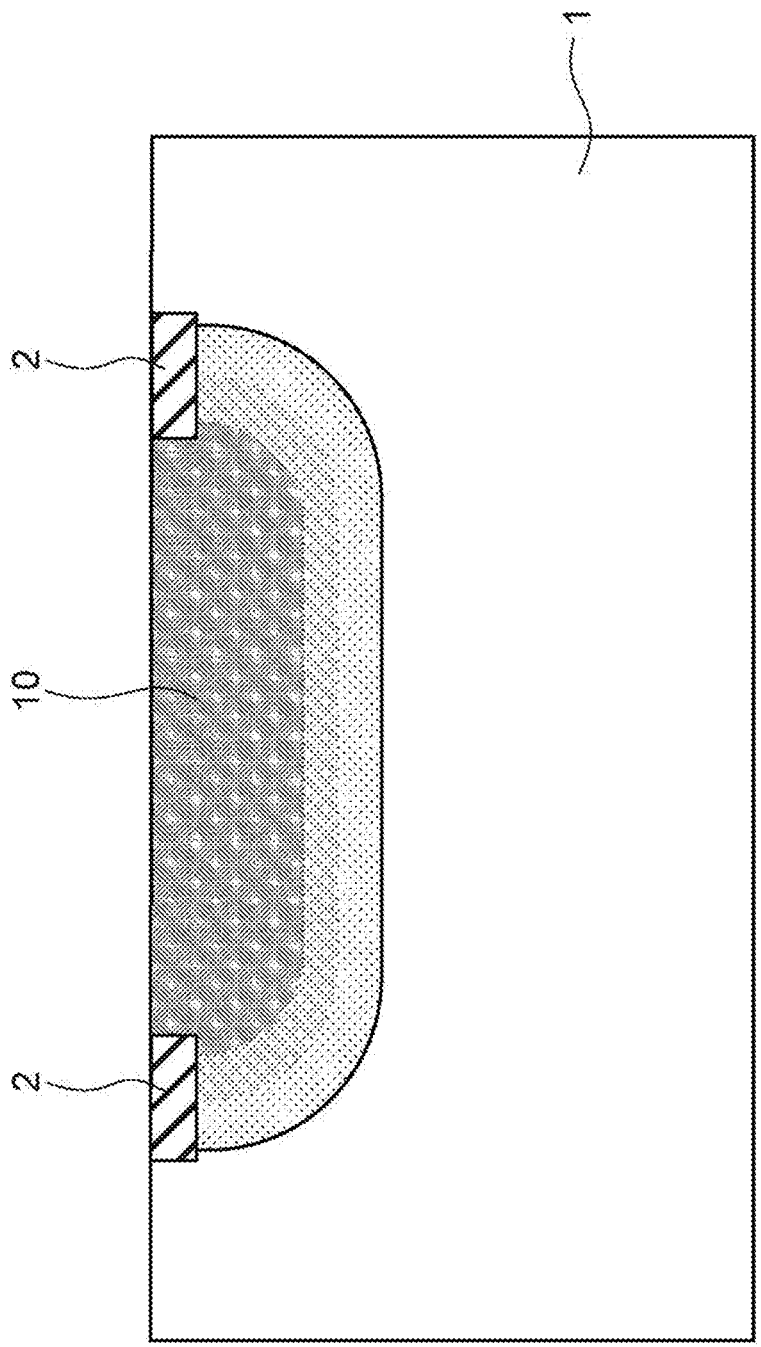
FIG. 2A is a schematic cross-sectional view illustrating an example of a method of fabricating the semiconductor device according to the first embodiment of the disclosure.
Figure 2B:
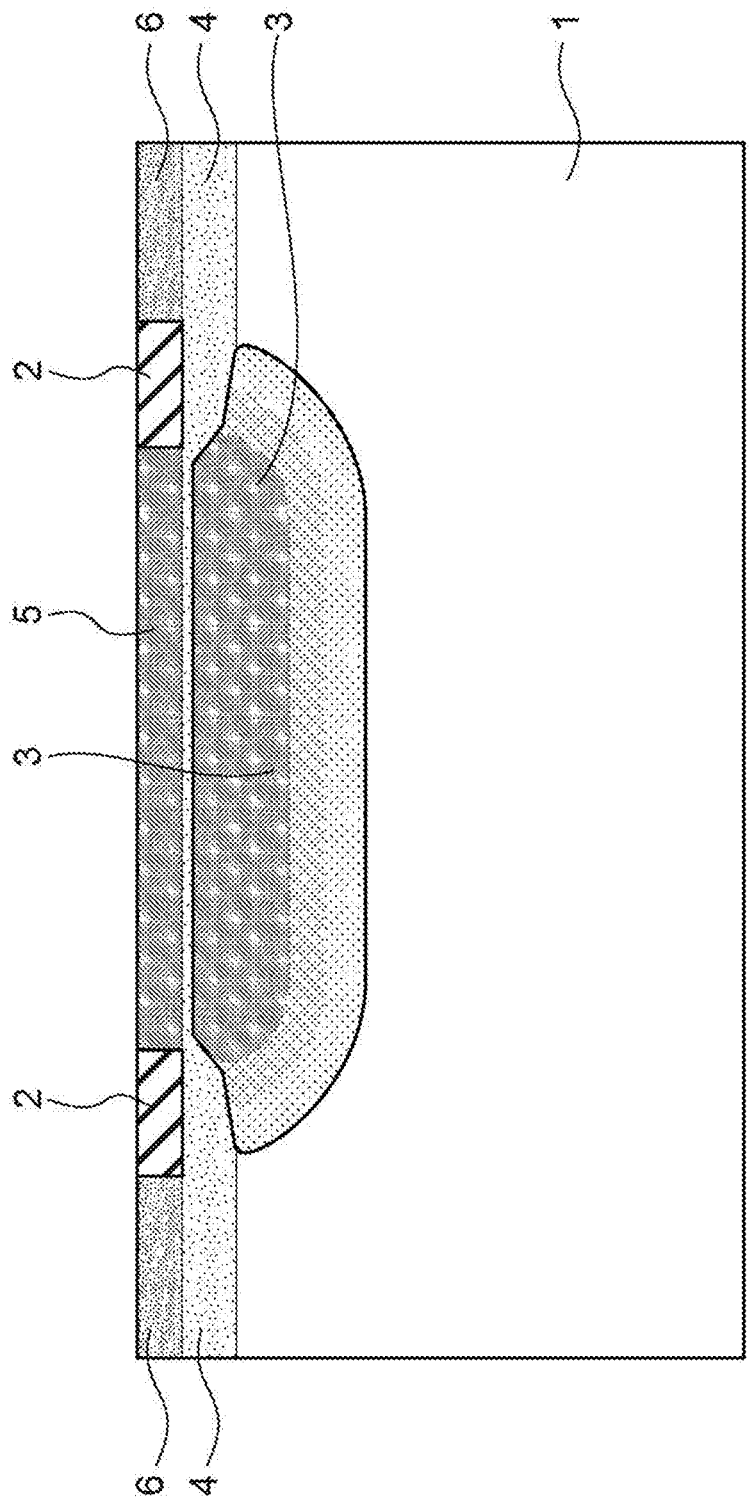
FIG. 2B is a schematic cross-sectional view illustrating an example of the method of fabricating the semiconductor device according to the first embodiment of the disclosure.

A method of fabricating the semiconductor device according to the first embodiment will be described. FIGS. 2A and 2B sequentially illustrate an example of the method of fabricating the semiconductor device according to the first embodiment.

(Preparation of Semiconductor Substrate 1)

First, a semiconductor substrate of the first conductivity type is prepared. The semiconductor substrate may be P-type or N-type, but a P-type semiconductor substrate is preferable from a viewpoint of easiness in fabrication. Also, a compound semiconductor substrate may be used as the semiconductor substrate, but a silicon substrate is preferable in a viewpoint of fabrication costs, easiness in procurement, or the like. Hereinafter, a case in which a P-type silicon substrate containing impurities such as boron is used will be described.

(Formation of Element Isolation Region 2)

After a silicon oxide film (not illustrated) having a thickness of about 0.02 μm is formed on a surface of the P-type silicon substrate 1 containing impurities such as boron using a thermal oxidation method, a silicon nitride film (not illustrated) having a thickness of about 0.2 μm is formed over the entire surface using a chemical vapor deposition (CVD) method.

Next, the silicon nitride film and the silicon oxide film in a desired region are removed by photolithography and etching methods, a groove having a depth of about 1 μm is formed on the surface of the silicon substrate 1, and thereby the element isolation region 2 is formed.

Thereafter, a silicon oxide film (not illustrated) having a thickness of about 0.02 μm is formed using a thermal oxidation method, and a first ion implantation of phosphorus (first ion implantation) with an energy of 2000 keV to an extent of up to a dose of $1 \times 10^{13}$ $cm^{-2}$ is performed once or a plurality of times on a region whose surface is to be the high-concentration N-type active layer 5. Next, a part of the surface (surface layer portion) of the P-type silicon substrate 1 is converted into an N-type region 10 by performing a heat treatment at about 1100° C. Through processes to be described below, the N-type region 10 is divided into a region to be the high-concentration N-type active layer 5, a region to be the N-type floating layer 3 below (at a deeper position than) the high-concentration N-type active layer 5, a region to be of a P-type between the high-concentration N-type active layer 5 and the N-type floating layer 3, and a region forming a part of the P-type well below the element isolation region.

Further, the element isolation region 2 is filled with a silicon oxide film by sequentially applying a CVD method and a chemical mechanical polishing (CMP) method.

Thereafter, the silicon nitride film and the silicon oxide film remaining outside the element isolation region 2 are removed (see FIG. 2A).

(Formation of P-Type Well 4, High-Concentration N-Type Impurity Region 5, High-Concentration P-Type Impurity Region 6, and N-Type Floating Layer 3)

Next, a silicon oxide film (not illustrated) of about 0.02 μm is formed on the surface of the silicon substrate 1 using a thermal oxidation method, an ion implantation of boron (second ion implantation) with an energy of 500 keV to an extent of up to a dose of $1 \times 10^{13}$ $cm^{-2}$ is performed once or a plurality of times over the entire diode region to be ion-implanted, and furthermore, a second ion implantation of phosphorus (third ion implantation) with an energy of 2000 keV to an extent of up to a dose of $1\times10^{13}$ cm$^{-2}$ is performed once or a plurality of times on the region whose surface is to be the high-concentration N-type active layer 5.

Further, an ion implantation of phosphorus and arsenic (fourth ion implantation) is performed on a surface of the region to be the high-concentration N-type active layer 5, and an ion implantation of boron (fifth ion implantation) is performed on a surface of the region to be the high-concentration P-type active layer 6. Thereafter, a heat treatment at about 1000° C. is performed to form the P-type well 4, the high-concentration N-type impurity region 5, and the high-concentration P-type impurity region 6 (see FIG. 2B).

As illustrated in FIG. 2B, the N-type floating layer 3 is formed below the high-concentration N-type active layer 5 with a part of the semiconductor substrate 1 interposed therebetween by forming the P-type well 4. This is because a region in which a concentration of boron forming the P-type well 4 is higher than a concentration of phosphorus is formed according to a depth. In FIG. 2B, a concentration of boron is higher than a concentration of phosphorus in a depth between the high-concentration N-type active layer 5 and the N-type floating layer 3.

(Formation of Interlayer Insulating Film 7, Contact 8, and Aluminum Interconnection 9)

Thereafter, the interlayer insulating film 7, the contact 8, and the aluminum interconnection 9 are sequentially formed using known methods, and furthermore, elements, circuits, and the like are formed or connected as necessary. Thereby, the semiconductor device according to the first embodiment or an electronic component including the semiconductor device according to the first embodiment can be fabricated.

A basic operation of the semiconductor device according to the first embodiment is the same as those of known semiconductor devices. A junction formed between the high-concentration N-type active layer 5 and the P-type well 4 serves as a PN junction diode that configures a protection diode. The high-concentration N-type active layer 5 and the high-concentration P-type active layer 6 function as a cathode electrode and an anode electrode, respectively. These are conducted through the contacts 8 to the separate aluminum interconnections 9 which are formed with the interlayer insulating film 7 made of a silicon oxide film interposed therebetween. When the protection diode of the present structure is inserted between an input/output unit of a semiconductor integrated circuit and the ground, the ground side is connected to an anode terminal, and the input/output side is connected to a cathode terminal.

A resistance of an element to ESD is generally evaluated using a transmission line pulse (TLP) method. In the evaluation, it is known that the higher the reverse breakdown voltage, the higher the actual breakdown voltage due to ESD, and the higher the forward breakdown current, the higher the actual breakdown current due to ESD.

Figure 3A:
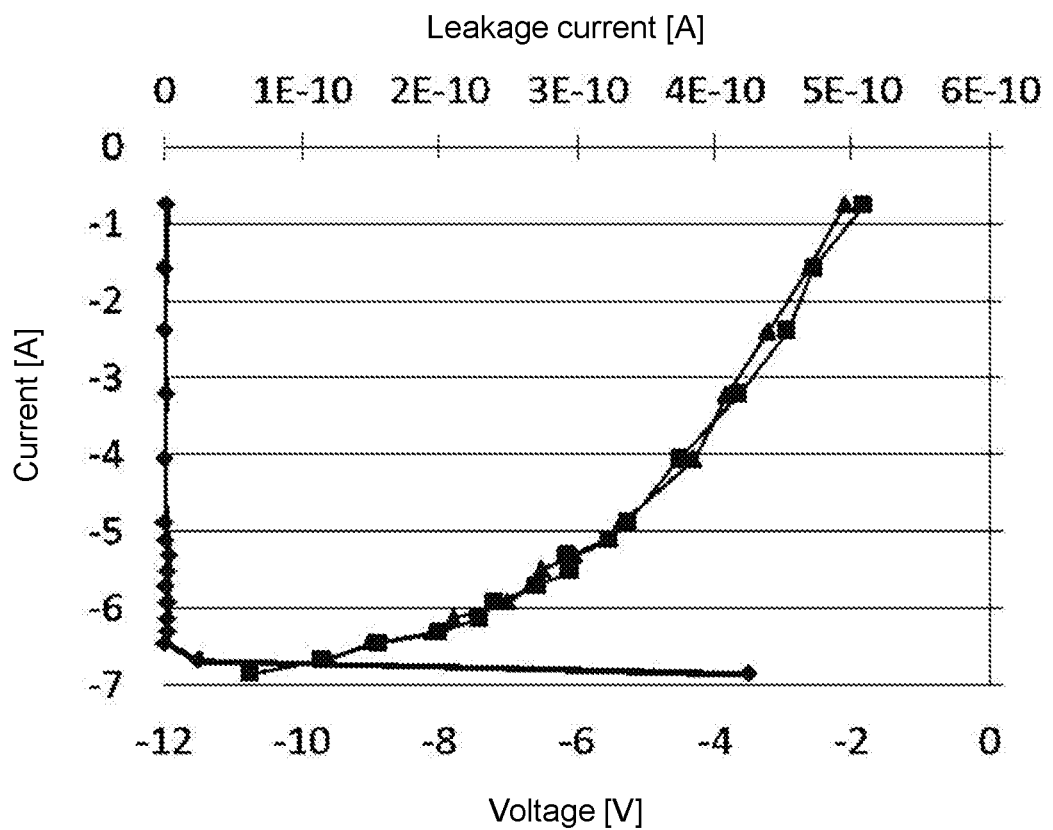
FIG. 3A is a view showing forward current-voltage characteristics of the semiconductor device fabricated as one example according to the first embodiment of the disclosure using a transmission line pulse (TLP) method.
Figure 3B:
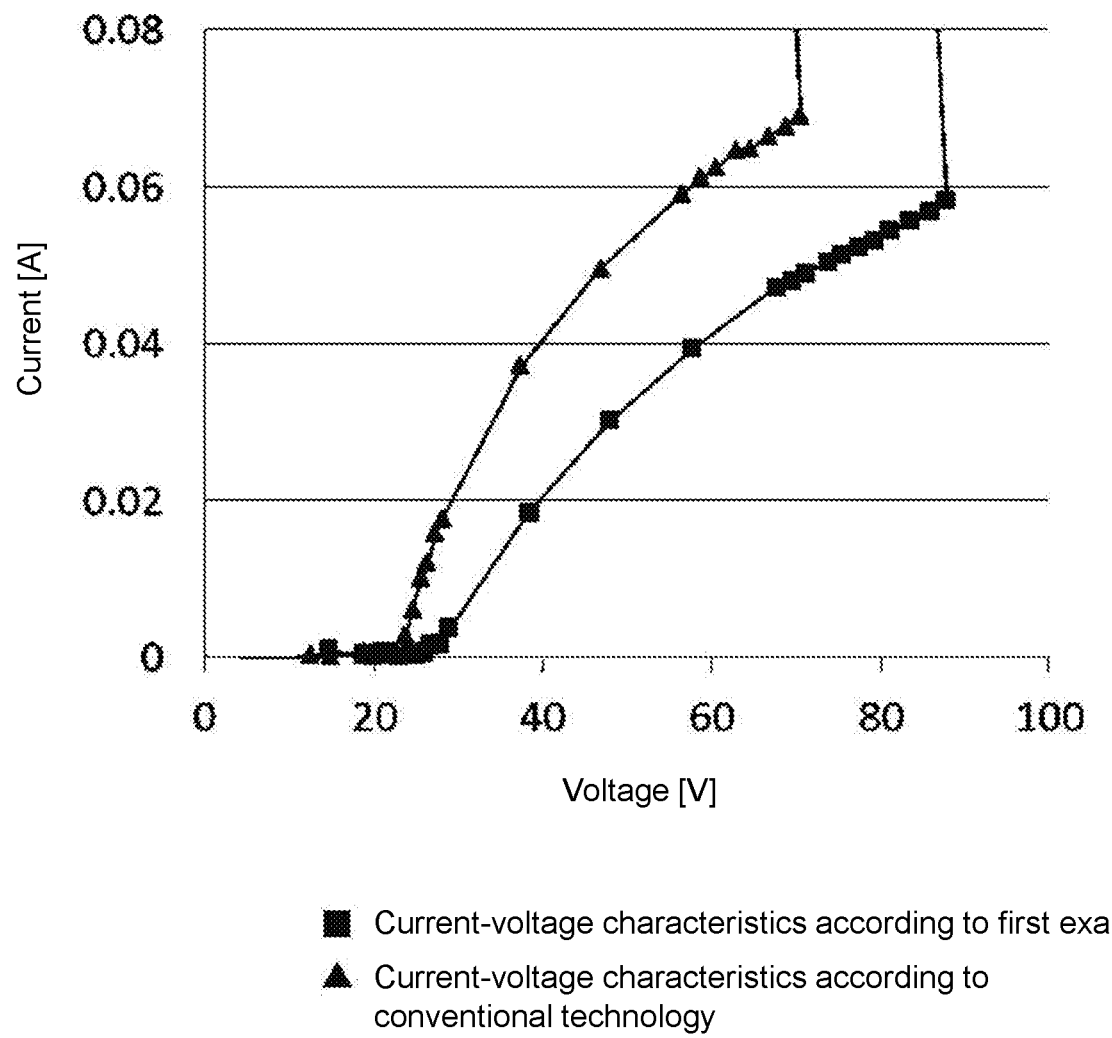
FIG. 3B is a view showing reverse current-voltage characteristics of the semiconductor device fabricated as one example according to the first embodiment of the disclosure using a TLP method.
Figure 9:
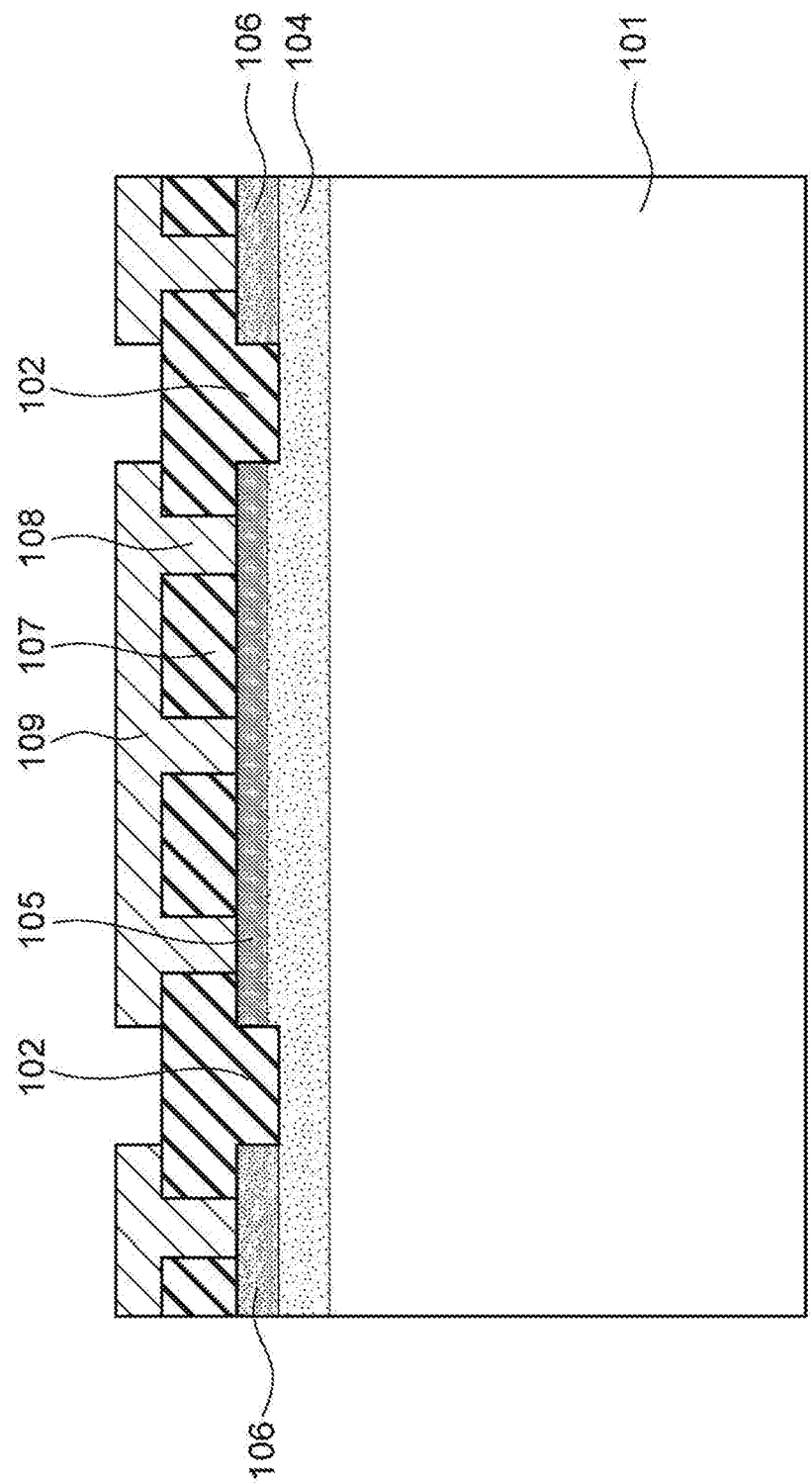
FIG. 9 is a schematic cross-sectional view illustrating an example of a cross-sectional structure of the conventional protection diode.

As one example of the semiconductor device according to the first embodiment, a series of evaluation results using a TLP method is shown in FIGS. 3A and 3B. FIG. 3A shows forward current-voltage characteristics using a TLP method. ■ indicates current-voltage characteristics according to one example of the first embodiment, ▲ indicates current-voltage characteristics according to a conventional technology (semiconductor device having a configuration illustrated in FIGS. 8 and 9), and ♦ indicates leakage current characteristics after evaluation of the current-voltage characteristics at each condition according to one example of the first embodiment. The forward breakdown current is defined by a current value immediately before the leakage current rapidly increases due to breakdown. FIG. 3B shows reverse current-voltage characteristics using a TLP method. ■ indicates current-voltage characteristics according to one example of the first embodiment, and ▲ indicates current-voltage characteristics according to the conventional technology. The reverse breakdown voltage is defined by a voltage value immediately before a current value rapidly increases due to breakdown.

In the first embodiment, it is ascertained that the forward current-voltage characteristics are equivalent to those of the conventional technology and a forward breakdown current is −6.4 A, which is also equivalent to −6.4 A of the conventional technology, whereas only a reverse breakdown voltage obtained from the reverse current-voltage characteristics is 87.8 V compared to 70.5 V in the conventional technology, which is improved by 17.3 V (24.5%). The reason why the reverse breakdown voltage is improved in the first embodiment is thought to be that a depletion layer extending from the junction between the high-concentration N-type active layer 5 and the P-type well 4 reaches the N-type floating layer 3 and the depletion layer further extends from there as a starting point, and as a result, an electric field is relaxed and carriers generated by an avalanche breakdown phenomenon are reduced, and thereby an increase in lattice temperature is suppressed.

On the other hand, the reason why the forward breakdown current is equivalent to that of the conventional technology in the first embodiment is thought to be that, since the depletion layer of the PN junction does not reach the N-type floating layer 3 at the time of being applied in a forward direction, a current path reaches the high-concentration P-type active layer 6 from the junction between the high-concentration N-type active layer 5 and the P-type well 4 as in the conventional PN junction diode regardless of the N-type floating layer 3.

Further, in the first embodiment, even when an ion implantation position for forming the N-type floating layer 3 becomes slightly different due to misalignment at the time of photolithography, or a spread of the N-type floating layer 3 becomes slightly different due to a variation in heat treatment conditions, a distance between the N-type floating layer 3 and the high-concentration P-type active layer 6 can always be made a certain amount or more due to presence of the P-type well 4. Therefore, an amount of variation in the characteristics with respect to variations at the time of fabrication can be suppressed.

Second Embodiment

Figure 4:
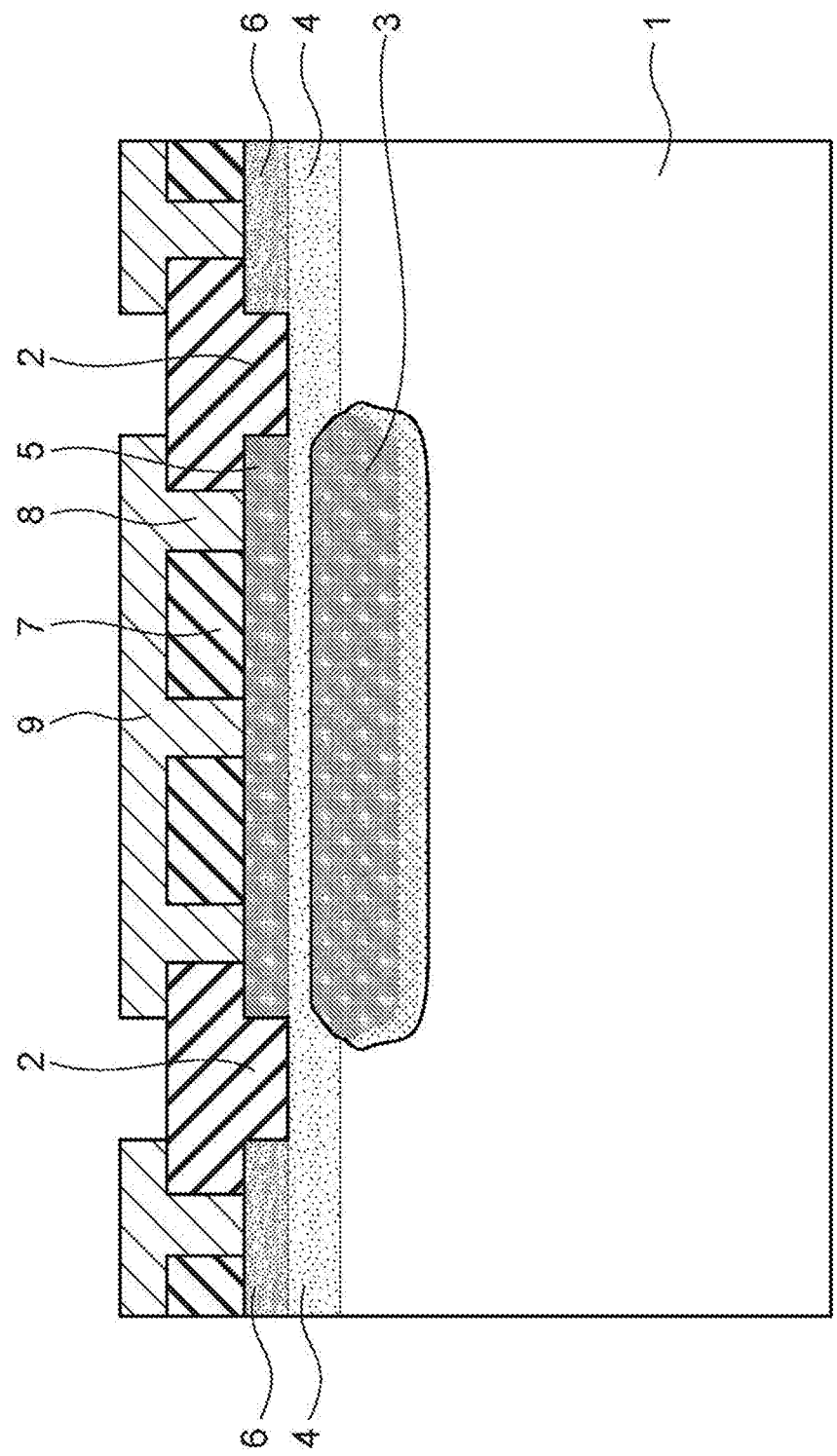
FIG. 4 is a schematic cross-sectional view illustrating an example of a semiconductor device according to a second embodiment of the disclosure.

FIG. 4 illustrates a cross section of a semiconductor device according to a second embodiment of the disclosure. The semiconductor device according to the second embodiment in a plan view has the same configuration as that in FIG. 8 and an increase in element area is suppressed. Also, an N-type floating layer is provided below a PN junction as in the first embodiment.

A basic operation of the semiconductor device according to the second embodiment is the same as those of known semiconductor devices. A junction formed between a high-concentration N-type active layer 5 and a P-type well 4 serves as a PN junction diode that configures a protection diode. The high-concentration N-type active layer 5 and a high-concentration P-type active layer 6 function as a cathode electrode and an anode electrode, respectively. These are conducted through contacts 8 to separate aluminum interconnections 9 which are formed with an interlayer insulating film 7 made of a silicon oxide film interposed therebetween.

When the protection diode of the present structure is inserted between an input/output unit of a semiconductor integrated circuit and the ground, the ground side is connected to an anode terminal, and the input/output side is connected to a cathode terminal.

In the semiconductor device according to the second embodiment, basically the same effects as those of the first embodiment can be obtained.

Figure 5A:
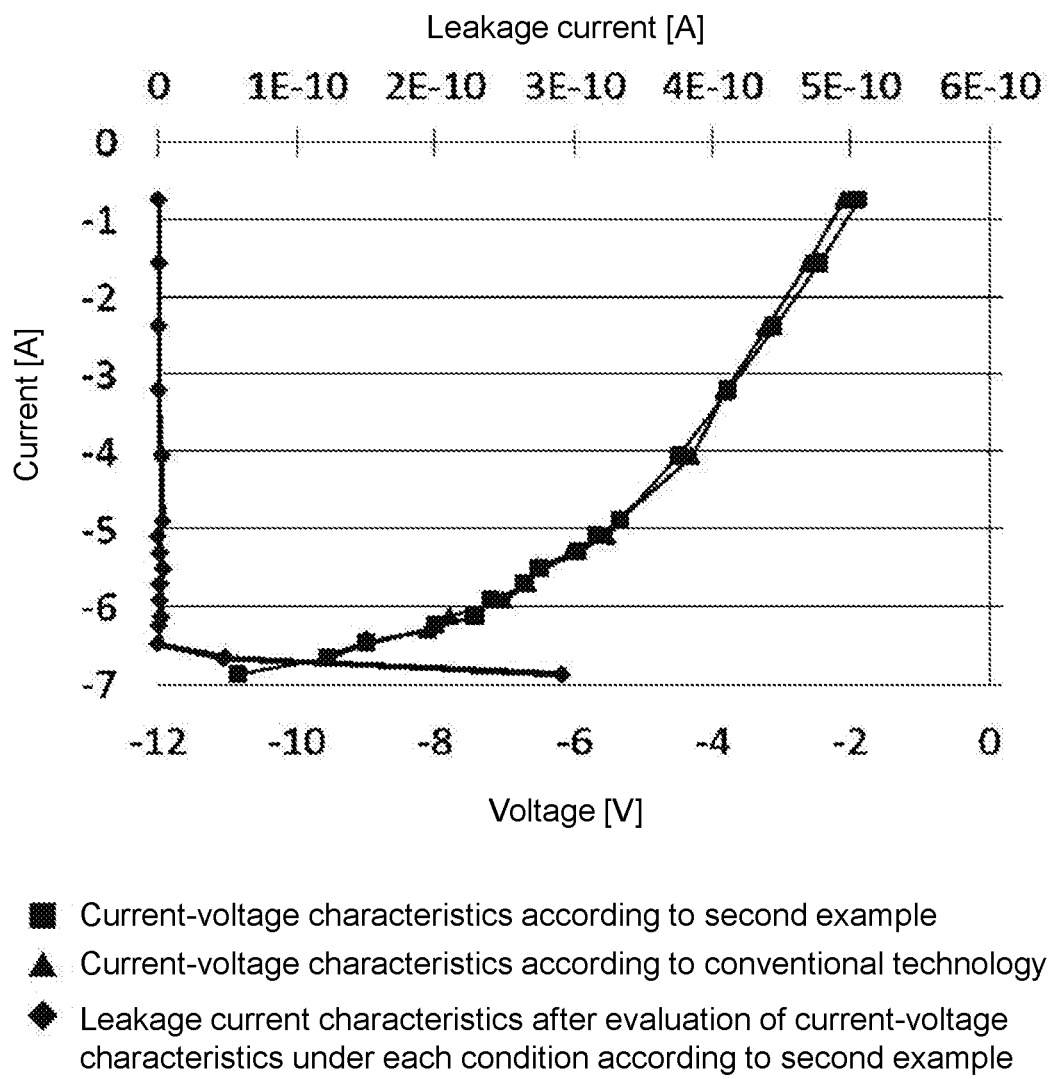
FIG. 5A is a view showing forward current-voltage characteristics of the semiconductor device fabricated as one example according to the second embodiment of the disclosure using a transmission line pulse (TLP) method.
Figure 5B:
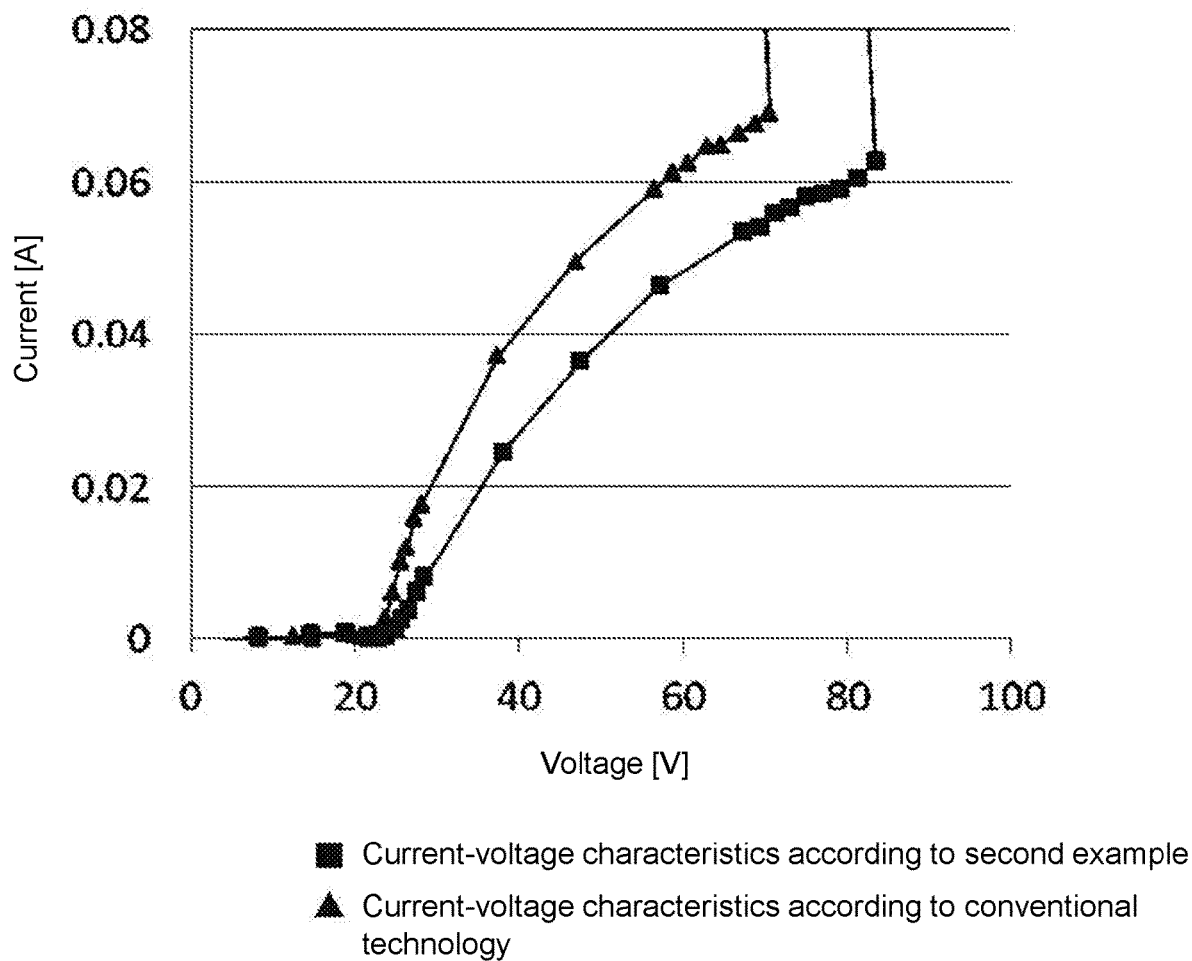
FIG. 5B is a view showing reverse current-voltage characteristics of the semiconductor device fabricated as one example according to the second embodiment of the disclosure using a TLP method.

As one example of the semiconductor device according to the second embodiment, a series of evaluation results using a transmission line pulse (TLP) method is shown in FIGS. 5A and 5B. FIG. 5A shows forward current-voltage characteristics using a TLP method. ■ indicates current-voltage characteristics according to one example of the second embodiment, ▲ indicates current-voltage characteristics according to a conventional technology, and ♦ indicates leakage current characteristics after evaluation of the current-voltage characteristics at each condition according to one example of the second embodiment. FIG. 5B shows reverse current-voltage characteristics using a TLP method. ■ indicates current-voltage characteristics according to one example of the second embodiment, and ▲ indicates current-voltage characteristics according to the conventional technology.

In the second embodiment, it is ascertained that the forward current-voltage characteristics are equivalent to those of the conventional technology and a forward breakdown current is −6.5 A, which is also equivalent to −6.4 A of the conventional technology, whereas only a reverse breakdown voltage obtained from the reverse current-voltage characteristics is 83.5 V compared to 70.5 V in the conventional technology, which is improved by 13.0 V (18.4%). The reason is the same as the reason described in the first embodiment.

In a method of fabricating the semiconductor device according to the second embodiment, of the first ion implantation of phosphorus (the first ion implantation) and the second ion implantation of phosphorus (the third ion implantation) which are illustrated in the method of fabricating the semiconductor device according to the first embodiment, only the second ion implantation of phosphorus (the third ion implantation) is performed.

Since the first ion implantation of phosphorus (the first ion implantation) illustrated in the first embodiment is not performed in the fabrication method of the second embodiment, processes can be simplified.

Also, as is apparent from FIG. 4, since a distance between the high-concentration N-type active layer 5 and the N-type floating layer 3 thereunder is wider than that in the first embodiment illustrated in FIG. 1, there is an advantage in that a margin for connection between the two can be obtained with respect to fluctuations or variations in ion implantation conditions or heat treatment conditions.

Third Embodiment

Figure 6:
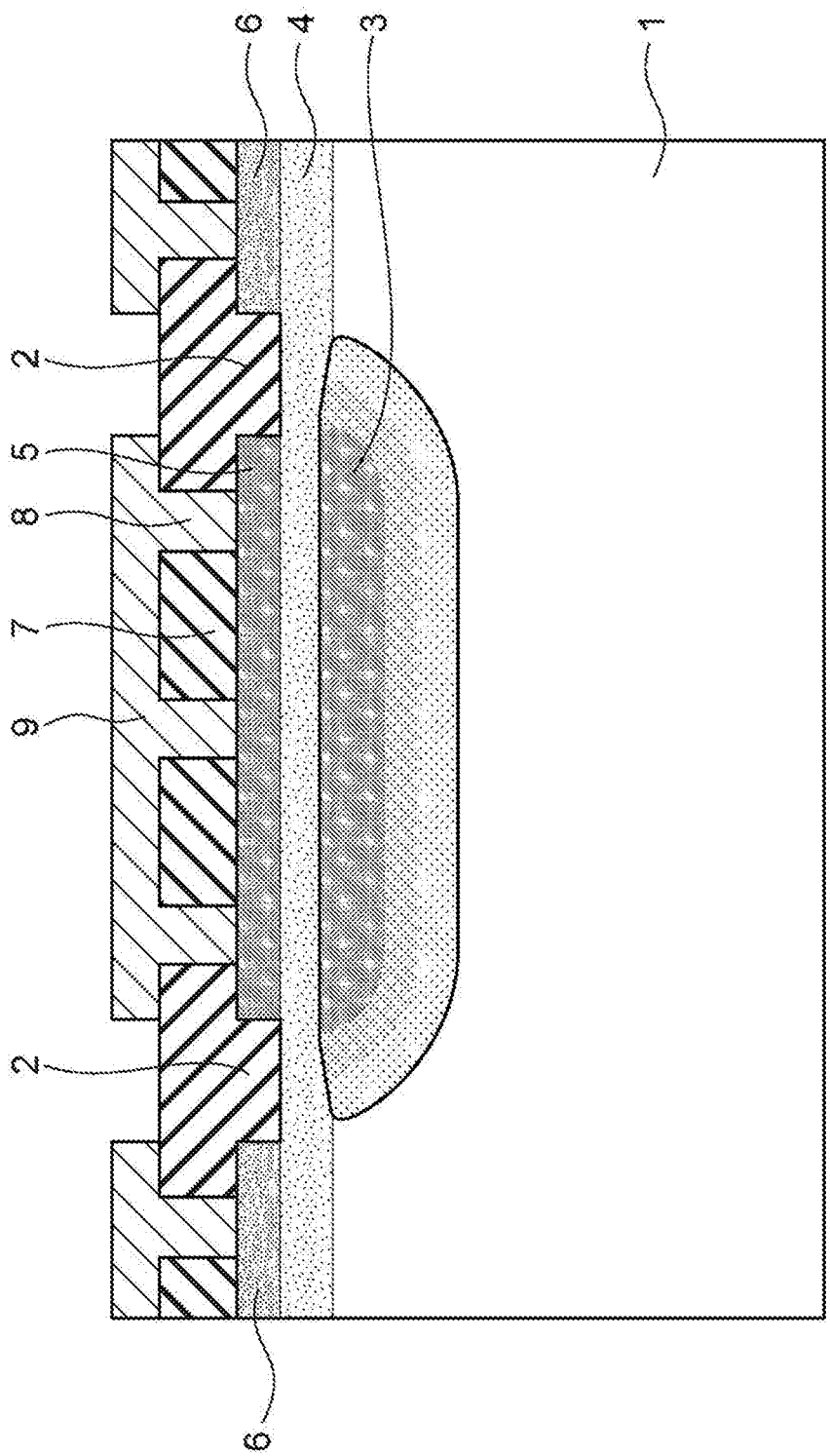
FIG. 6 is a schematic cross-sectional view illustrating an example of a semiconductor device according to a third embodiment of the disclosure.

FIG. 6 illustrates a cross section of a semiconductor device according to a third embodiment of the disclosure. The semiconductor device according to the third embodiment in a plan view has the same configuration as that in FIG. 8 and an increase in element area is suppressed. Also, an N-type floating layer 3 is provided below a PN junction as in the first embodiment.

A basic operation of the semiconductor device according to the third embodiment is the same as those of known semiconductor devices. A junction formed between a high-concentration N-type active layer 5 and a P-type well 4 serves as a PN junction diode that configures a protection diode. The high-concentration N-type active layer 5 and a high-concentration P-type active layer 6 function as a cathode electrode and an anode electrode, respectively. These are conducted through contacts to separate aluminum interconnections 9 which are formed with an interlayer insulating film 7 made of a silicon oxide film interposed therebetween. When the protection diode of the present structure is inserted between an input/output unit of a semiconductor integrated circuit and the ground, the ground side is connected to an anode terminal, and the input/output side is connected to a cathode terminal.

In the semiconductor device according to the third embodiment, basically the same effects as those of the first and second embodiments can be obtained.

Figure 7A:
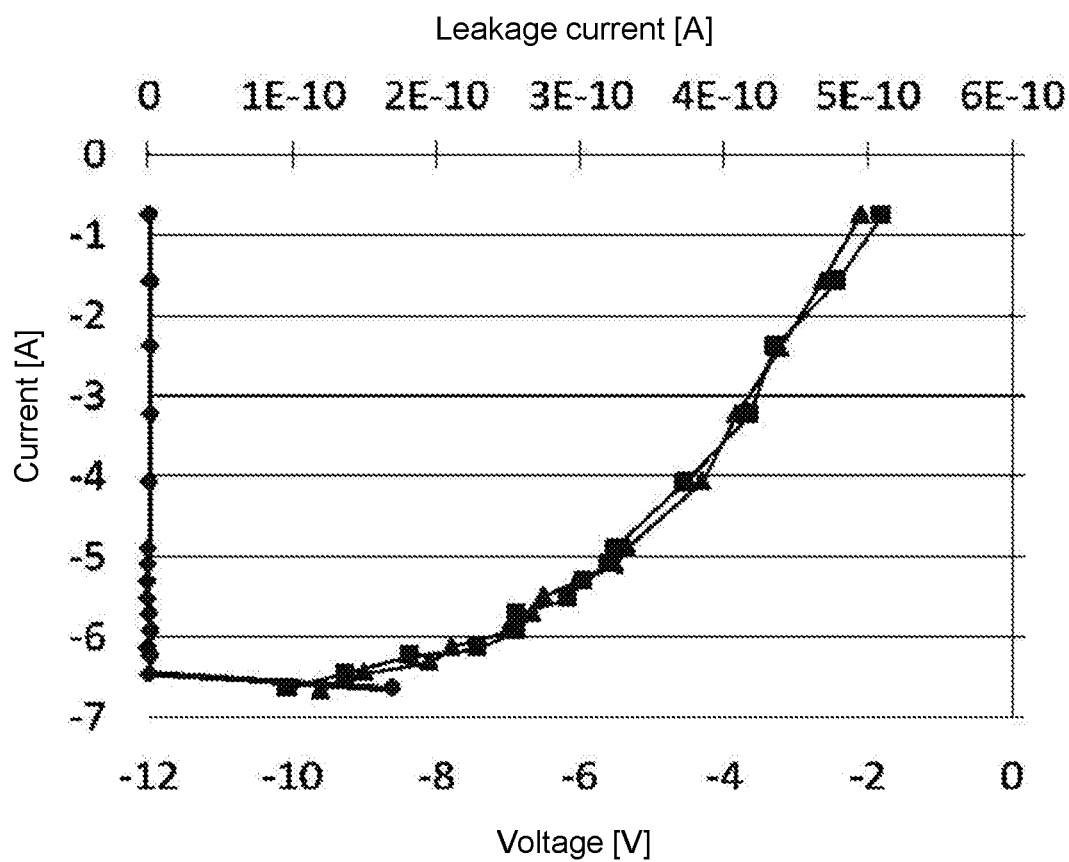
FIG. 7A is a view showing forward current-voltage characteristics of the semiconductor device fabricated as one example according to the third embodiment of the disclosure using a transmission line pulse (TLP) method.
Figure 7B:
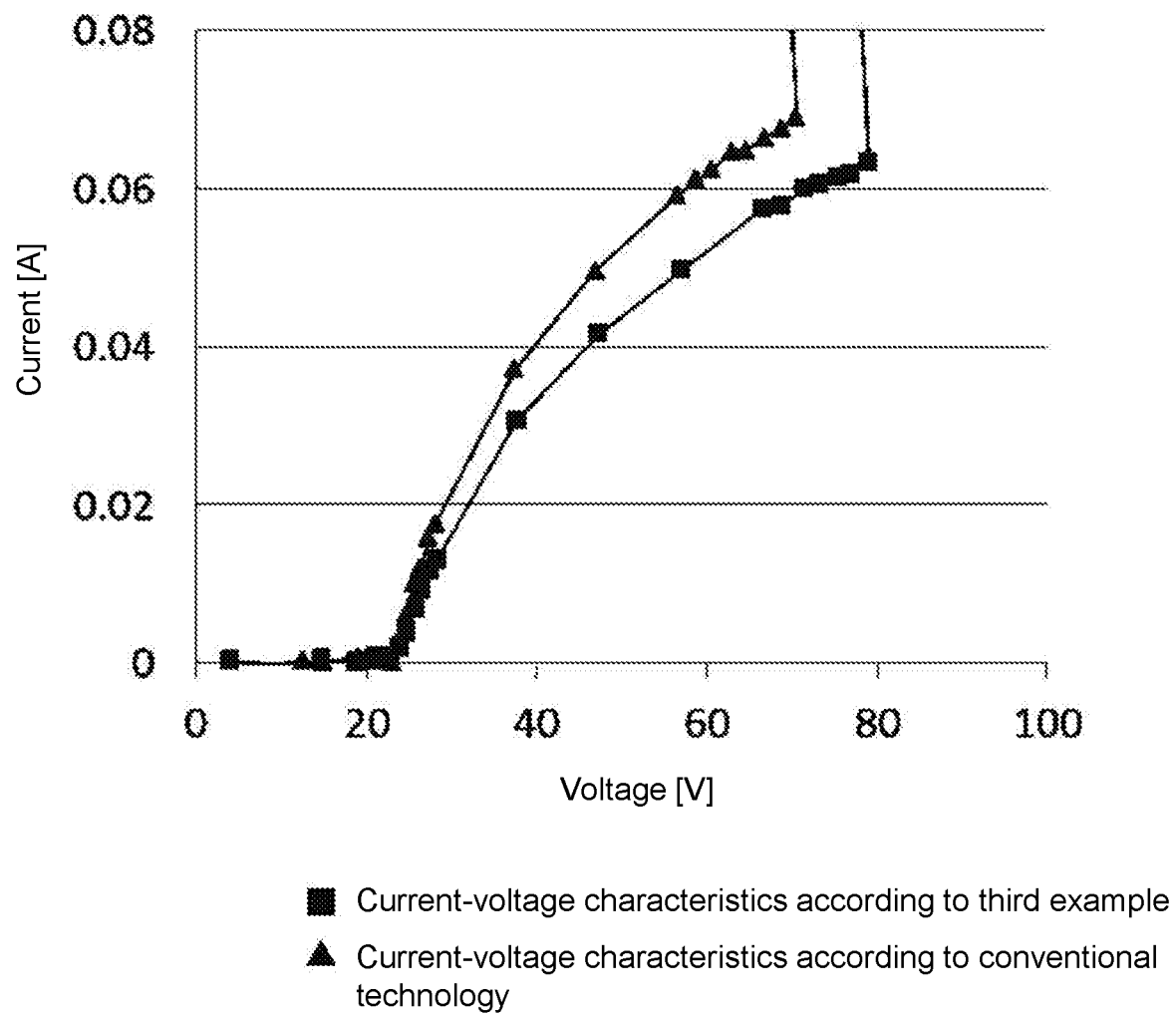
FIG. 7B is a view showing reverse current-voltage characteristics of the semiconductor device fabricated as one example according to the third embodiment of the disclosure using a TLP method.

As one example of the semiconductor device according to the third embodiment, a series of evaluation results using a transmission line pulse (TLP) method is shown in FIGS. 7A and 7B. FIG. 7A shows forward current-voltage characteristics using a TLP method. ■ indicates current-voltage characteristics according to one example of the third embodiment, ▲ indicates current-voltage characteristics according to a conventional technology, and ♦ indicates leakage current characteristics after evaluation of the current-voltage characteristics at each condition according to one example of the third embodiment. FIG. 7B shows reverse current-voltage characteristics using a TLP method. ■ indicates current-voltage characteristics according to one example of the third embodiment, and ▲ indicates current-voltage characteristics according to the conventional technology.

In the third embodiment, it is ascertained that the forward current-voltage characteristics are equivalent to those of the conventional technology and a forward breakdown current is −6.4 A, which is also equivalent to −6.4 A of the conventional technology, whereas only a reverse breakdown voltage obtained from the reverse current-voltage characteristics is 79.0 V compared to 70.5 V in the conventional technology, which is improved by 8.5 V (12.1%). The reason is the same as the reason described in the first embodiment.

In a method of fabricating the semiconductor device according to the third embodiment, of the first ion implantation of phosphorus (the first ion implantation) and the second ion implantation of phosphorus (the third ion implantation) which are illustrated in the method of fabricating the semiconductor device according to the first embodiment, only the first ion implantation of phosphorus (the first ion implantation) is performed.

Since the second ion implantation of phosphorus (the third ion implantation) illustrated in the first embodiment is not performed in the fabrication method of the third embodiment, processes can be simplified.

Also, in the third embodiment, as is apparent from FIG. 6, since a distance between the high-concentration N-type active layer 5 and the N-type floating layer 3 thereunder is wider than those in the first and second embodiments illustrated in FIGS. 1 and 4, there is an advantage in that a margin for connection between the two can be obtained with respect to fluctuations or variations in ion implantation conditions or heat treatment conditions.

Either one or both of the first ion implantation of phosphorus and the second ion implantation of phosphorus for forming the N-type floating layer 3 illustrated in the first to third embodiments can be made to be the same as either one or both of the processes of forming the N-type wells of two types used in different regions in the same integrated circuit. In this case, since formation of the N-type floating layer 3 may be dealt with only by changing a layout with respect to that in the conventional technology and the process is the same as that of the conventional technology, a reverse breakdown voltage thereof can be improved without increasing the number of processes.

Similarly, the ion implantation of boron that is performed over the entire surface for forming the N-type floating layer 3 can be made to be the same as the process of forming the P-type well 4 in the same integrated circuit.

Also, even when N-type and P-type are switched in fabricating the elements in the first to third embodiments, the same effects can be expected. However, when a P-type substrate is used, it is necessary to form a P-type floating layer below a high-concentration P-type active layer formed on a surface in an N-type well formed by an ion implantation of phosphorus and a subsequent heat treatment. In this case, when a PN diode is inserted between an input/output unit of a semiconductor integrated circuit and a power supply, the input/output side is connected to an anode terminal and the power supply side is connected to a cathode terminal.

Numerical values, materials, shapes, film formation methods, or the like in the description of the above embodiments or the embodiments illustrated in the drawings are examples, and the semiconductor device and the method of fabricating the same according to the disclosure are not limited to the above embodiments. Material, thicknesses, shapes, fabrication methods, or the like can be appropriately changed within a range in which effects of the disclosure are achieved.

Also, an application of the diode element in the semiconductor device according to the disclosure is not limited, and the disclosure is not limited to a protection diode that protects an internal circuit of a semiconductor device against an excessive input voltage or current due to ESD.

What is claimed is:

1. A semiconductor device comprising:
   a diode element using a PN junction, in which on a surface of a semiconductor substrate of a first conductivity type which is P-type or N-type comprises:
      a high-concentration first conductivity type impurity region of the first conductivity type;
      a high-concentration second conductivity type impurity region of a second conductivity type which is a conductivity type opposite to the first conductivity type; and
      an element isolation region sandwiched between the high-concentration first conductivity type impurity region and the high-concentration second conductivity type impurity region; and
   a floating layer of the second conductivity type separated from the high-concentration second conductivity type impurity region below the high-concentration second conductivity type impurity region on the semiconductor substrate, wherein the floating layer is a layer that overlaps the high-concentration second conductivity type impurity region in a plan view.

2. The semiconductor device according to claim 1, wherein the first conductivity type is P-type and the second conductivity type is N-type.

3. The semiconductor device according to claim 1, wherein the diode element is a protection diode which protects an internal circuit of a semiconductor integrated circuit against electrostatic discharge.

4. A method of fabricating a semiconductor device, comprising:
   a process of preparing a semiconductor substrate of the first conductivity type;
   a process of forming the element isolation region on the semiconductor substrate;
   a process of forming the floating layer by performing a second impurity implantation and at least one impurity implantation of a first impurity implantation and a third impurity implantation among the first impurity implantation in which impurities of the second conductivity type are ion-implanted once or a plurality of times, the second impurity implantation in which impurities of the first conductivity type are ion-implanted once or a plurality of times, and the third impurity implantation in which impurities of the second conductivity type are ion-implanted once or a plurality of times in the numerical order of the impurity implantations for a region including a portion of the semiconductor substrate to be the high-concentration second conductivity type impurity region, wherein the floating layer is a layer that overlaps the high-concentration second conductivity type impurity region in a plan view;
   a process of forming the high-concentration second conductivity type impurity region by ion-implanting impurities of the second conductivity type once or a plurality of times into the portion of the semiconductor substrate to be the high-concentration second conductivity type impurity region; and
   a process of forming the high-concentration first conductivity type impurity region by ion-implanting impurities of the first conductivity type once or a plurality of times into a portion of the semiconductor substrate to be the high-concentration first conductivity type impurity region.

5. The method of fabricating the semiconductor device according to claim 4, wherein, only the third impurity implantation is performed as the at least one impurity implantation of the first impurity implantation and the third impurity implantation in the process of forming the floating layer.

6. The method of fabricating the semiconductor device according to claim 4, wherein, only the first impurity implantation is performed as the at least one impurity implantation of the first impurity implantation and the third impurity implantation in the process of forming the floating layer.

7. The method of fabricating the semiconductor device according to claim 4, wherein some or all of the impurity implantations in the process of forming the floating layer are performed concurrently with an impurity implantation in a region other than the diode element.

* * * * *